US006876088B2

United States Patent
Harvey

(10) Patent No.: US 6,876,088 B2
(45) Date of Patent: Apr. 5, 2005

(54) FLEX-BASED IC PACKAGE CONSTRUCTION EMPLOYING A BALANCED LAMINATION

(75) Inventor: Paul Marlan Harvey, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/346,286

(22) Filed: Jan. 16, 2003

(65) Prior Publication Data

US 2004/0140538 A1 Jul. 22, 2004

(51) Int. Cl.⁷ .......................... H01L 23/48; H01L 23/02
(52) U.S. Cl. ...................... 257/778; 257/686; 257/723; 257/724; 257/738
(58) Field of Search ................................ 257/673, 674, 257/676, 685, 686, 723, 724, 738, 777, 778; 438/107–110, 123

(56) References Cited

U.S. PATENT DOCUMENTS

| | | |
|---|---|---|
| 4,642,889 A | 2/1987 | Grabbe |
| 5,097,393 A | 3/1992 | Nelson et al. |
| 5,108,553 A | 4/1992 | Foster et al. |
| 5,252,857 A | 10/1993 | Kane et al. |
| 5,266,746 A | 11/1993 | Nishihara et al. |
| 5,357,403 A | 10/1994 | Haller et al. |
| 5,474,458 A | 12/1995 | Vafi et al. |
| 5,476,818 A | 12/1995 | Yanof et al. |
| 5,578,796 A | 11/1996 | Bhatt et al. |
| 5,639,696 A | 6/1997 | Liang et al. |
| 5,642,261 A | 6/1997 | Bond et al. |
| 5,689,091 A * | 11/1997 | Hamzehdoost et al. ..... 174/255 |
| 5,736,679 A | 4/1998 | Kresge et al. |
| 5,758,413 A * | 6/1998 | Chong et al. .................. 29/852 |
| 5,814,393 A | 9/1998 | Miyaake et al. |
| 5,814,847 A | 9/1998 | Shihadeh et al. |
| 5,829,124 A | 11/1998 | Kresge et al. |
| 5,854,507 A | 12/1998 | Miremadi et al. |
| 5,861,666 A | 1/1999 | Bellaar |
| 5,891,753 A | 4/1999 | Akram |
| 6,034,332 A | 3/2000 | Moresco et al. |
| 6,050,832 A | 4/2000 | Lee et al. |
| 6,102,710 A | 8/2000 | Beilin et al. |
| 6,104,082 A | 8/2000 | Berlin et al. |
| 6,104,084 A | 8/2000 | Ishio et al. |
| 6,121,676 A | 9/2000 | Solberg |
| 6,137,164 A | 10/2000 | Yew et al. |
| 6,140,707 A | 10/2000 | Plepys et al. |

(Continued)

FOREIGN PATENT DOCUMENTS

JP        2001-156121         6/2001

OTHER PUBLICATIONS

Farber, A. S.; "High–Capacitance Power Distribution Network"; *IBM Technical Disclosure Bulletin*; Mar. 1967; vol. 9, No. 10; p. 1266.

Cavaliere, J. R. et al.; "High–Performance Single–Chip Module"; *IBM Technical Disclosure Bulletin*; Jun. 1981; vol. 24, No. 1A; pp. 46–48.

Primary Examiner—Hung Vu
(74) Attorney, Agent, or Firm—Carr LLP; Robert M. Carwell

(57) ABSTRACT

The present invention provides for a balanced laminated integrated circuit package. The package includes a two metal layer bumped circuit, a first adhesive layer having a thickness on a first side of the bumped circuit, a first outer conductive layer having a thickness bonded to the first adhesive layer and a second adhesive layer having a thickness substantially equal to the thickness of the first adhesive layer on a second side of the bumped circuit. The invention also includes a second outer conductive layer bonded to the second adhesive layer, the second outer conductive layer having a thickness substantially equal to the thickness of the first outer conductive layer.

6 Claims, 4 Drawing Sheets

U.S. PATENT DOCUMENTS

| | | |
|---|---|---|
| 6,153,508 A | 11/2000 | Harvey |
| 6,175,158 B1 | 1/2001 | Degani et al. |
| 6,175,161 B1 | 1/2001 | Goetz et al. |
| 6,194,250 B1 | 2/2001 | Melton et al. |
| 6,222,265 B1 | 4/2001 | Akram et al. |
| 6,291,267 B1 | 9/2001 | Dore et al. |
| 6,297,551 B1 | 10/2001 | Dudderar et al. |
| 6,331,939 B1 | 12/2001 | Corisis et al. |
| 6,333,563 B1 | 12/2001 | Jackson et al. |
| 6,756,685 B2 * | 6/2004 | Tao .......................... 257/778 |

* cited by examiner

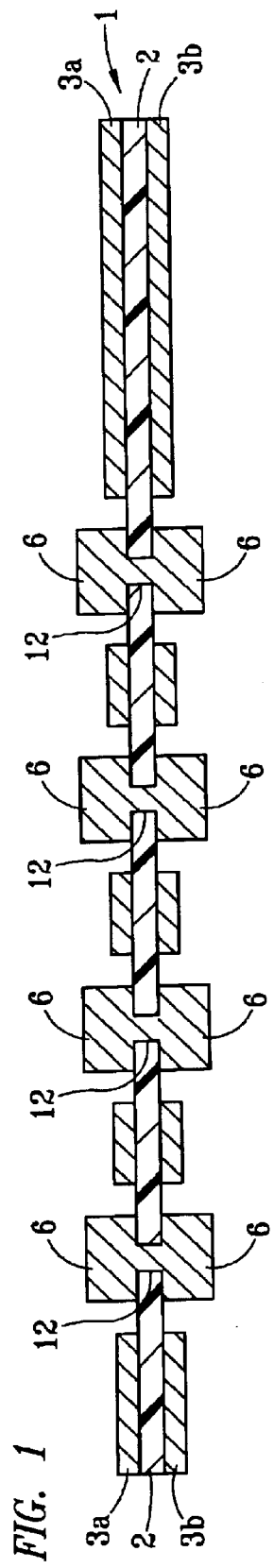
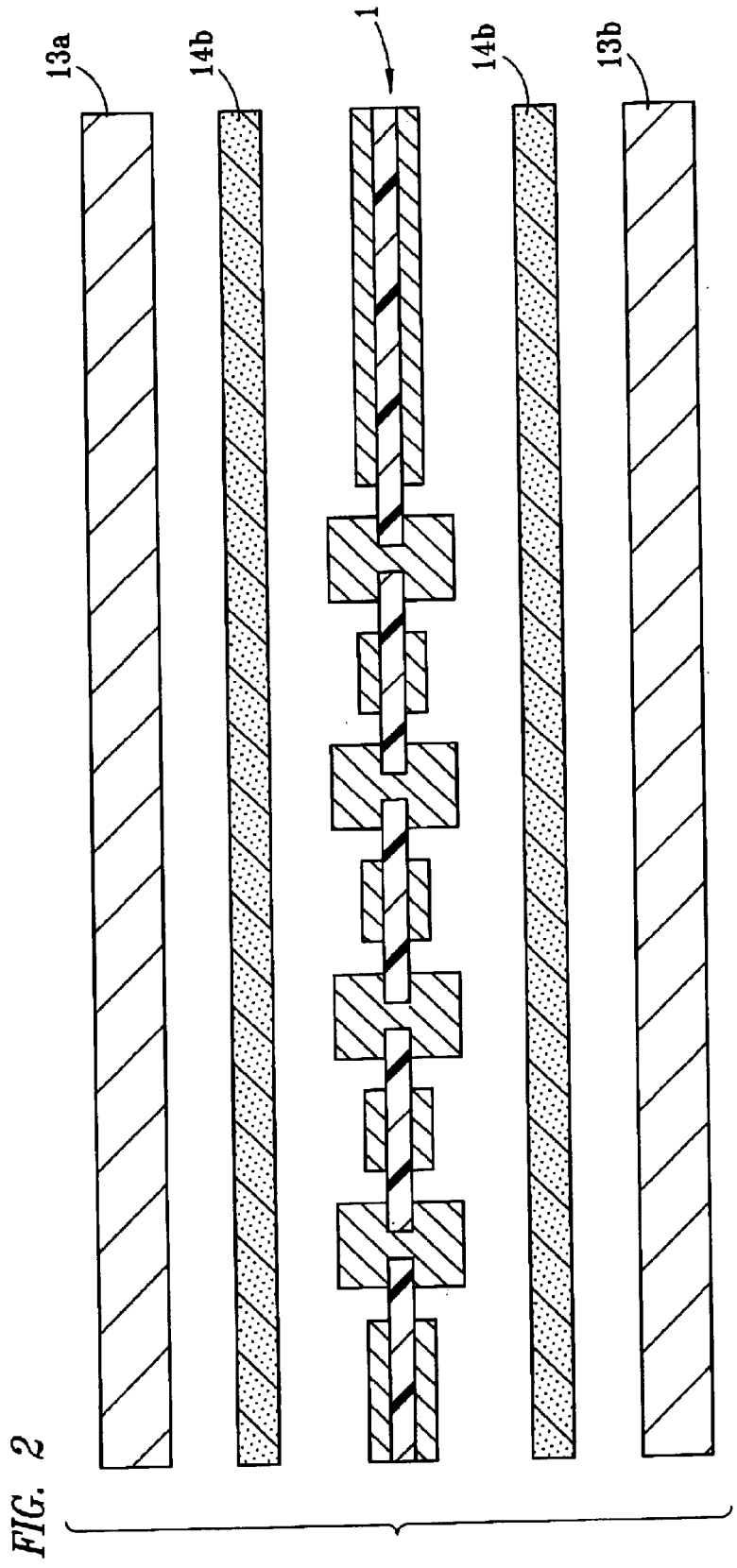

FLEX-BASED IC PACKAGE CONSTRUCTION EMPLOYING A BALANCED LAMINATION

CROSS-REFERENCED APPLICATIONS

This application relates to co-pending U.S. patent applications entitled "Method and Apparatus for Interconnecting a Relatively Fine Pitch Circuit Layer and Adjacent Power Plane(s) in a Laminated Construction" (Docket No. AUS920020578US) and "Ball Grid Array Package Construction With Raised Solder Ball Pads" (Docket No. AUS920020580US1), filed concurrently herewith, the contents of which are hereby incorporated by reference.

BACKGROUND OF THE INVENTION

1. Field of the Invention

This invention relates generally to the field of integrated circuit packaging.

2. Description of the Related Art

In the manufacture of integrated circuits, extremely fine circuits are photolithographically placed onto a chip, also called a die. The circuits on the chip terminate at conductive terminals on the face of the chip, which must be electrically connected to power and to other chips. For protection of the chip and ease of handling, these chips are bonded to a substrate and to electrical connections ultimately leading to conventional printed circuit boards. One attractive way of connecting the conductive terminals on a chip is where the terminals are distributed over the face of the chip and connected to a circuit substrate by conductive paste or solder balls in a pattern of "C4" connections.

In some integrated circuit packaging applications, there are at least two integrated circuit chips having very high communication bandwidth or bitrate between them. For example, a high speed processor often requires a very high communication bandwidth with an associated memory chip. A cost-effective, high bandwidth interconnection between two (or more) devices can be done by stacking devices with the C4 patterns facing each other and electrically interconnecting them vertically using very short connections between the chips. This approach ensures a consistent, very short length interconnect between the devices which can enable extremely wide, high speed, low skew busses between the two devices.

Where chips are stacked face to face, an interposer between the devices is usually necessary to efficiently distribute power to the devices and facilitate high yield assembly and test. Ideally, the interposer should be no thicker than required to adequately distribute power to the devices since the thickness of the interposer increases the interconnect length of the busses between the devices and effectively degrades the electrical performance of the interconnect.

Traditional alumina ceramic substrates have been tried as the interposer; however, the screened tungsten and/or molybdenum crosshatched conductor patterns employed for power planes in alumina constructions offer relatively high resistance. As a result, numerous power planes must be employed in the design to facilitate efficient power distribution, which results in a relatively thick interposer. Glass ceramic constructions employing copper paste instead of molybdenum or tungsten, which offer significantly lower resistance per conductor layer and therefore potentially thinner interposer constructions, have also been tried. However, cost and availability of the glass ceramic construction make it less desirable for many high volume, low cost markets.

Low cost, organic substrate constructions based on sequential build-up of fine pitch, thin wiring layers over a rigid, drilled printed circuit board (PCB) core represent a lower cost approach. However, it is difficult to cost-effectively drill the rigid PCB to support the C4 pitch necessary for most interposer designs geared for high bandwidth. Although more sophisticated, multi-layer organic structures exist for high performance, niche applications that can support the necessary vertical interconnect density (for example, laser drill density), such as IBM HyperBGA®, these substrates are typically even more expensive than the ceramic substrates cited above.

Bumped, two metal layer (2ML) flex circuits can be used as an interposer. As used herein, "2ML flex circuits" includes circuits having an intermediate insulating layer generally thinner than about 75 microns. However, bumped 2ML flex circuits require a stiffener bonded to the flex circuit, adjacent to the location of the integrated circuit die. Commonly used single-sided stiffeners in these constructions must be rigid enough to overcome the tendency of an unbalanced lamination to warp. This typically requires high modulus metal stiffeners having a thickness in the 500–1000 micron range.

OBJECTS OF THE INVENTION

It is an object of the present invention to overcome the foregoing shortcomings in the prior art.

It is another object of the present invention to provide a laminated flex circuit assembly that is capable for providing a very short z-dimension interconnection between opposed integrated circuit chips. It is another object of the present invention to provide a laminated flex circuit assembly that requires thinner metal stiffeners.

It is another object of the present invention to provide a laminated circuit assembly that permits close spacing of the chip edge to the border of the chip window.

It is another object of the present invention to provide a laminated circuit assembly that minimizes the tendency of the assembly to warp.

It is a particular object of the present invention to overcome these shortcomings by using a substrate and method of construction of a laminated circuit assembly having a two metal layer (2ML) bumped flex circuit technology with a novel, balanced laminate construction using relatively thin, preferably copper, planes placed on both sides of the 2ML circuit layer.

SUMMARY OF THE INVENTION

In accordance with a preferred embodiment of the present invention, an integrated circuit package is provided comprising a two metal layer bumped circuit, a first adhesive layer having a thickness on a first side of the bumped circuit, a first outer conductive layer having a thickness bonded to the first adhesive layer, and a second adhesive layer having a thickness substantially equal to the thickness of the first adhesive layer on a second side of the bumped circuit. The preferred embodiment further comprises a second outer conductive layer bonded to the second adhesive layer, the second outer conductive layer having a thickness substantially equal to the thickness of the first outer conductive layer.

In accordance with a preferred aspect of this embodiment, the thickness of each outer conductive layer is between about 25 microns and 300 microns.

In accordance with another preferred aspect of this embodiment, the conductive layer includes copper.

In accordance with another preferred aspect of this embodiment, at least one of the first and second outer conductive layers has a window defined therethrough for receiving an integrated circuit die.

In accordance with another preferred aspect of this embodiment, the window has a border and further comprising an integrated circuit die having an edge, the edge being positioned no farther than about 0.5 mm from the border.

In accordance with a preferred embodiment of the present invention, an integrated circuit package is provided comprising a two metal layer bumped circuit having a plurality of z-dimension vias on a central portion of a first side, each of the vias having a raised z-dimension interconnection bump on each side of the via for interconnecting opposed integrated circuit dies, a first adhesive layer having a thickness on the first side of the bumped circuit, a first outer conductive layer having a thickness bonded to the first adhesive layer, and a second adhesive layer having a thickness substantially equal to the thickness of the first adhesive layer on a second side of the bumped circuit.

In accordance with a preferred aspect of this embodiment, the thickness of each outer conductive layer is between about 25 microns and 300 microns.

In accordance with another preferred aspect of this embodiment, the conductive layer includes copper.

In accordance with another preferred aspect of this embodiment, at least one of the first and second outer conductive layers has a window defined therethrough for receiving an integrated circuit die.

In accordance with another preferred aspect of this embodiment, the window has a border and further comprising an integrated circuit die having an edge, the edge being positioned no farther than about 0.5 mm from the border.

In accordance with another preferred aspect of this embodiment, the first outer conductive layer has a first window defined therethrough for receiving a first integrated circuit die and the second outer conductive layer has a second window defined therethrough for receiving a second integrated circuit die, the first adhesive layer having a first cavity defined therein disposed beneath the first window, the first cavity having a depth sufficient to expose top portions of the interconnection bumps on the first side of the bumped circuit, and the second outer conductive layer having a second window defined therethrough for receiving a second integrated circuit die. Further, the second adhesive layer preferably has a first cavity defined therein disposed beneath the second window, the second cavity having a depth sufficient to expose top portions of the interconnection bumps on the second side of the bumped circuit.

In accordance with another preferred aspect of this embodiment, the thickness of each outer conductive layer is between about 25 microns and 300 microns.

In accordance with another preferred aspect of this embodiment, the conductive layer includes copper.

In accordance with another preferred aspect of this embodiment, at least one of the first and second windows has a border and an integrated circuit die having an edge, the edge being positioned no farther than about 0.5 mm from the border.

In accordance with another embodiment of the present invention, a method of packaging and electrically interconnecting first and second opposed integrated circuit dies to an interposing bumped circuit having a plurality of z-dimension vias on a central portion of a first side, each of the vias having a raised z-dimension interconnection bump on each side of the via for interconnecting the opposed integrated circuit dies is provided, comprising the steps of placing a first adhesive layer having a thickness on the first side of the bumped circuit, bonding a first outer conductive layer having a thickness to the first adhesive layer, placing a second adhesive layer having a thickness substantially equal to the thickness of the first adhesive layer on a second side of the bumped circuit, and bonding a second outer conductive layer to the second adhesive layer, the second outer conductive layer having a thickness substantially equal to the thickness of the first outer conductive layer. This preferred embodiment further comprises etching a first window through the first outer conductive layer for receiving the first integrated circuit die, etching a first cavity into the first adhesive layer beneath the first window, the first cavity having a depth sufficient to expose top portions of the interconnection bumps on the first side of the bumped circuit, etching a second window through the second outer conductive layer for receiving the second integrated circuit die, and etching a first cavity into the first adhesive layer beneath the first window, the first cavity having a depth sufficient to expose top portions of the interconnection bumps on the first side of the bumped circuit. This preferred embodiment further comprises depositing conductive paste or solder on the raised interconnection bumps on each side of the central portion of the bumped circuits, placing the first integrated circuit die into the first window and onto the raised interconnection bumps, and placing the second integrated circuit die into the second window and onto the raised interconnection bumps.

In accordance with another preferred aspect of this embodiment, the thickness of each outer conductive layer is between about 25 microns and 300 microns.

In accordance with another preferred aspect of this embodiment, the conductive layer includes copper.

In accordance with another preferred aspect of this embodiment, at least one of the first and second windows has a border and an integrated circuit die having an edge, the edge being positioned no farther than about 0.5 mm from the border.

BRIEF DESCRIPTION OF THE DRAWINGS

For a more complete understanding of the present invention, and the advantages thereof, reference is now made to the following Detailed Description taken in conjunction with the accompanying drawings, in which:

FIG. 1 is a cross-sectional view through a two metal layer (2ML) bumped circuit usable in the present invention, showing an arrangement of vias having raised bumps at each end of the via;

FIG. 2 is a cross-sectional view through the 2ML bumped circuit depicted in FIG. 1, with a conductive power plane on the upper and lower sides of the 2ML bumped circuit with an insulating adhesive layer in between, showing a first step in the construction of a laminated circuit used in the present invention;

DETAILED DESCRIPTION

Figure 3:
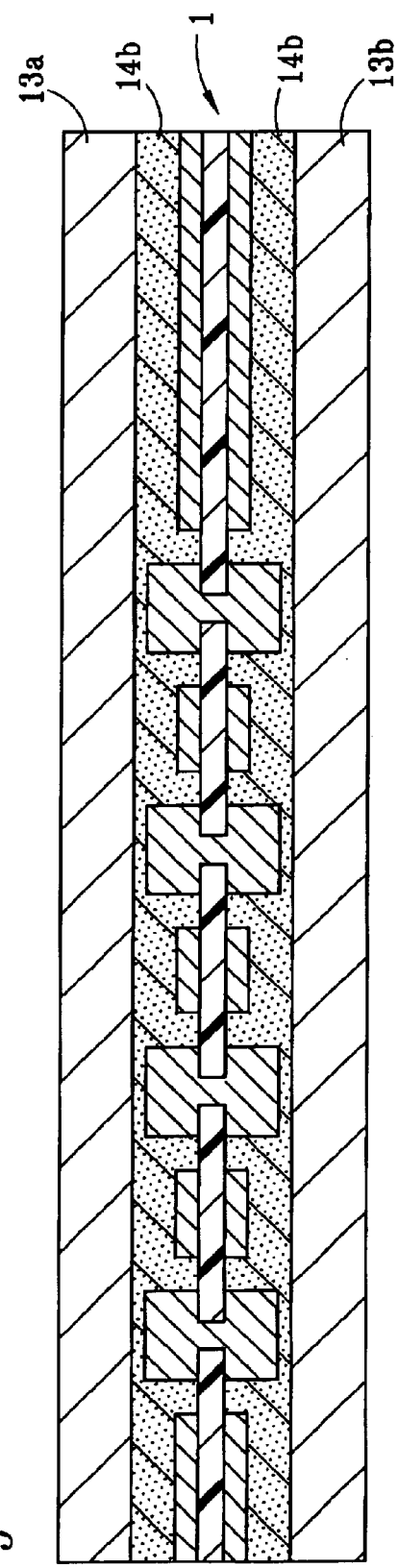
FIG. 3 is a cross-sectional view through the 2ML bumped circuit and conductive layers on the upper and lower sides of the 2ML bumped circuit depicted in FIG. 2, showing a subsequent lamination step in the construction of a laminated circuit used in the present invention.

The foregoing and other objects, features and advantages of the invention will be apparent from the following more particular description of a preferred embodiment of the invention, as illustrated in the accompanying drawings, wherein like reference numbers represent like parts.

Turning now to the drawings in detail, and initially to FIG. 1 thereof, a 2ML bumped circuit layer 1, showing one representative raised bump 6 on each circuit layer, is depicted. The 2ML bumped circuit layer or assembly 1 has a medial insulating substrate 2, preferably polyimide, and is preferably though not necessarily of the type referred to as "flex" technology. The insulating substrate 2 is preferably thin, as thin as 25 microns or less, and has vias 12 defined in the z-dimension of the insulating substrate 2 which are preferably formed by using lasers, mechanical drilling or other means. It is to be understood that the bumps 6 are preferably generally symmetrical, so that the width of the bump 6 along the longitudinal orientation (the "x-dimension") is preferably approximately the same as for the width of the bump 6 in the "y-dimension" (for example, into the plane of the paper), although this is not required.

In a preferred embodiment of the invention, the width of the bumps 6 is between about 10 and 150 microns, with between about 25 microns and 50 microns being preferred. It should be noted, however, that the width of the bumps 6 can be as small as desired, the lower limit being limited only by circuit manufacturing technology.

Turning now to FIG. 2, insulating adhesive layers 14a and 14b are applied between the bumped circuit layer 3a and outer conductive layer 13a, and between the bumped circuit layer 3b and outer conductive layer 13b. As depicted in FIG. 3, after positioning the outer conductive layers so that a portion of the outer conductive layer is generally over the location of the desired bump to be interconnected, the outer layers are laminated onto the bumped circuit by the medium of the insulating adhesive layers 14a and 14b. It should be noted that the outer conductive layers can be laminated onto the bumped circuit simultaneously or sequentially to each other. Insulating adhesive layers 14a and 14b are preferably substantially the same thickness.

Each of the overlying outer conductive layers 13a and 13b preferably have substantially equal thickness, which is important for balancing the lamination to minimize warping.

Preferably, the outer conductive layers 13a and 13b are relatively thin, in the range of approximately 25 to 300 microns thick, preferably between about 50 and 150 microns thick, and most preferably approximately 125 microns thick. The outer conductive layers 13a and 13b are preferably composed of a material having a high thermal conductivity, and most preferably copper metal which is economical and has a very high thermal conductivity.

Figure 4:
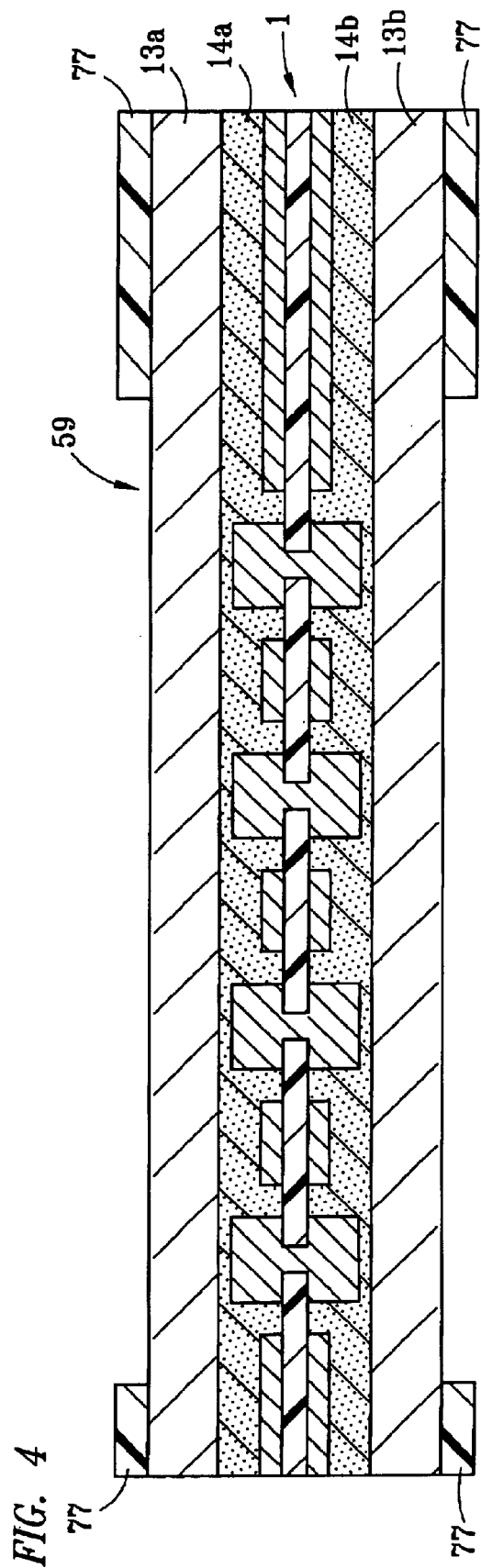
FIG. 4 is a cross-sectional view through the 2ML bumped circuit and laminated conductive layers on the upper and lower sides of the 2ML bumped circuit depicted in FIG. 3, showing the steps of photoresist application, imaging and removal of unimaged photoresist in the construction of chip windows through each of the power planes.
Figure 5:
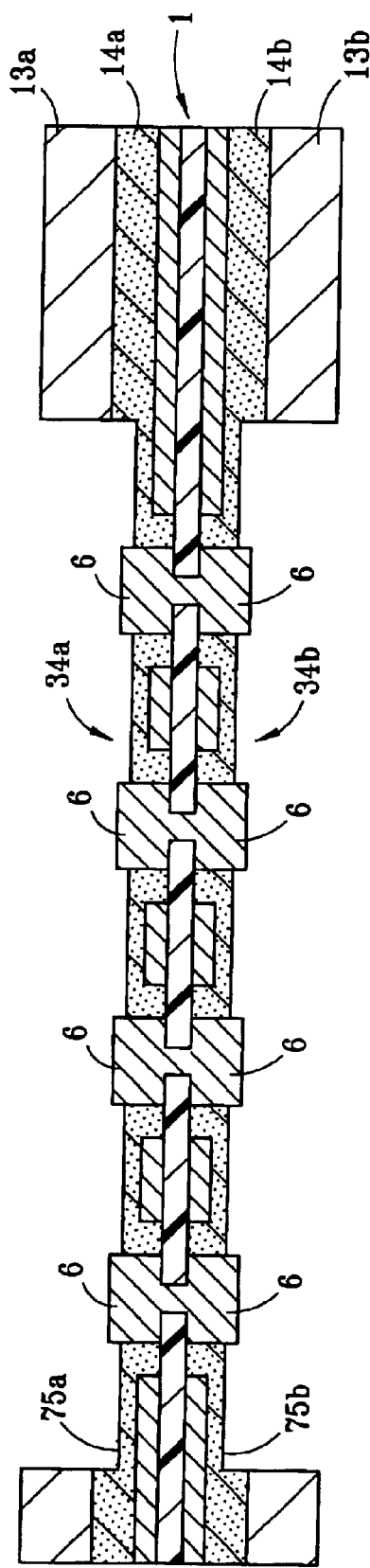
FIG. 5 is a cross-sectional view through the 2ML bumped circuit and laminated conductive layers on the upper and lower sides of the 2ML bumped circuit depicted in FIG. 4, showing a subsequent step wherein respective windows are etched in the power planes on each side of the 2ML bumped circuit.

Turning now to FIG. 4, a cross-sectional view through the bumped circuit layer 1 and overlying outer conductive layers 13a and 13b on the upper and lower sides of the bumped circuit layer are depicted, showing several steps in the manufacture. First, a photoresist 77 is applied in a well-known manner. Then, the photoresist 77 is imaged at portions other than an unimaged area, where chip windows 34a and 34b are to be etched into outer conductive layers 13a and 13b. Also at this time, if desired, the outer conductive layers 13a and 13b can be imaged in the pattern required to create circuit traces and/or other features in the conductive layer at desired locations. Third, the unimaged areas of photoresist 77 are removed creating an exposed area 59 at the location the windows 34a and 34b (as shown in FIG. 5) are to be formed. It should be noted that the foregoing steps can be accomplished simultaneously for the upper and lower outer conductive layers, or sequentially, if desired.

FIG. 5 shows a subsequent etching step. In this step, the now exposed, unimaged areas of the respective outer conductive layers 13a and 13b are etched away, leaving the adhesive layer. It should be noted that this step can be accomplished simultaneously or sequentially for each outer conductive layer, if desired.

Figure 6:
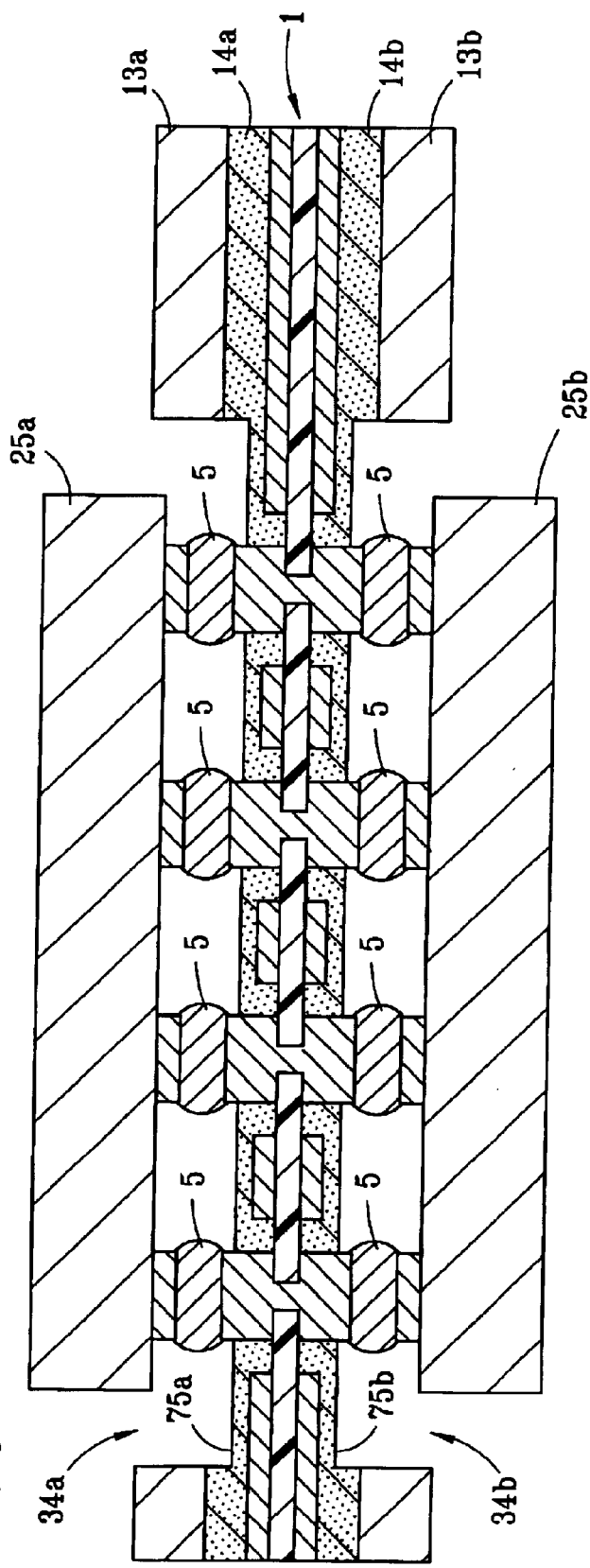
FIG. 6 is a cross-sectional view through the 2ML bumped circuit and laminated power planes on the upper and lower sides of the 2ML bumped circuit depicted in FIG. 5, showing a subsequent step wherein the adhesive layers below the respective windows are etched away to expose the top of the respective bumps.

FIG. 6 shows the step wherein the insulating adhesive layers 14a and 14b are plasma etched away, forming a cavity 75 in each of the adhesive layers 14a and 14b, exposing the tops 16 of the circuit bumps 6 on each respective side. This process is then repeated for the lower power plane. It should be noted that this step can be accomplished simultaneously for the upper and lower outer conductive layers, or sequentially, if desired. It should also be noted that there is no requirement that the windows 34a and 34b on the upper and lower outer conductive layers 13a and 13b be the same size.

In the next step, as shown in FIG. 6, solder or conductive paste 5 has been applied to the circuit bumps 6 on both sides of the 2ML circuit layer 1, chip dies 25a and 25b placed into the respective chip windows 34a and 34b and conductive paste or solder 5 applied to connect the circuit bumps 6 to the corresponding interconnect pads of the chip dies. Because of the use of the balanced lamination, for example, substantially equal thickness outer conductive layers 13a and 13b on opposite sides of the 2ML circuit layer 1, a very small clearance between the dies 25a and 25b and chip windows 34a and 34b can be used, between approximately 0.25 and 0.5 mm. Use of this small gap reduces overall packet size and maximizes heat transfer between the die and the overlying outer conductive layers.

The subtle difference of using a balanced lamination lay-up in the present invention facilitates achieving other features and advantages. For example, because of its relative thinness as compared to single sided stiffeners, the conductive material of the upper and lower conductive layers 13a and 13b can be cost-effectively etched and electrically interconnected to bumps 6 on the 2ML high density flex in precise locations as outlined in the referenced patent application [AUS920020578US1] without the need for costly precision drilling of outer conductive layers.

Connection of the power planes in that manner affords all the wiring density and power distribution capability necessary to design and fabricate very cost-effective interposers that can be optimized for extremely high bandwidth, vertical interconnection between devices.

Furthermore, the bottom power plane can be used to add thickness to the construction in the BGA solder ball region. (BGA solder balls have a diameter in the range of approximately 400 to 600 microns, as opposed to solder balls that may be used on the C4 bumps that may be approximately 25 to 100 microns or so.) This is advantageous because it provides the clearance in the package to facilitate attachment of a device on the bottom side of the interposer without undue wafer back-grinding.

Preserving a majority of the metal in both power planes facilitates excellent DC power distribution, provides good electrical reference planes for the signal distribution on the fine pitch 2ML flex circuitry and maintains the mechanical integrity of the construction.

The thin, 2ML flex circuitry in the chip interconnect area contributes perhaps the minimum parasitic inductance, resistance and capacitance possible in a vertical interconnection. This allows the busses that interconnect the devices through the interposer to run at very high speeds with minuscule signal degradation caused by the interposer.

The 2ML flex structure also distributes and provides power efficiently to the devices in the vertical interconnect region. Preliminary estimates indicate that a 2ML flex with 18 micron copper planes on both sides, in accordance with an exemplary embodiment of the invention, can provide power to a 300 micron power and ground C4 array in a 35 mm package with less than 1 mohm total DC resistance. The medial insulating layer of a typical 2ML flex circuit is a very thin dielectric (~25 microns). Transmission of signals from one side of the 2ML flex circuit to the other travel across a very short distance, for superior AC transmission. This thin dielectric also provides substantial intrinsic, embedded capacitance and extremely low inductance which enables very low power distribution impedance necessary for high frequency operation. Preliminary estimates indicate that about 3–5 nF of intrinsic capacitance is available at an extremely low inductance in a 35 mm package construction. Inductance and impedance models and specific estimates are not available at this time; however, expectations are that the effective loop inductance of this type of package construction could be conservatively estimated at less than 20 pH.

Figure 7:
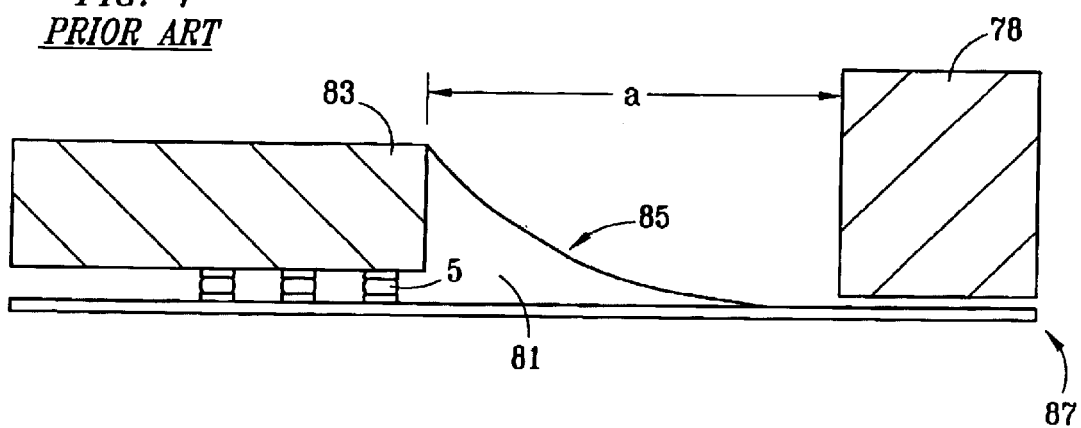
FIG. 7 is a simplified cross-sectional view through an integrated circuit package using flex technology in accordance with the prior art, showing a use of a thick, single sided stiffener.

FIG. 7 shows a prior art, flex-based package having a thick, single sided stiffener 78 having a thickness in the range of about 500 to 1000 microns. Underfill 81 is provided at the edge of the chip 83. The fillet 85 of the underfill 81 dictates, in significant measure, the integrity of the device to interposer 87 interconnect reliability. To prevent disturbing the shape of the fillet, the edge of stiffener 78 must typically be pulled back 1–3 mm away from the edge of chip 83.

Figure 8:
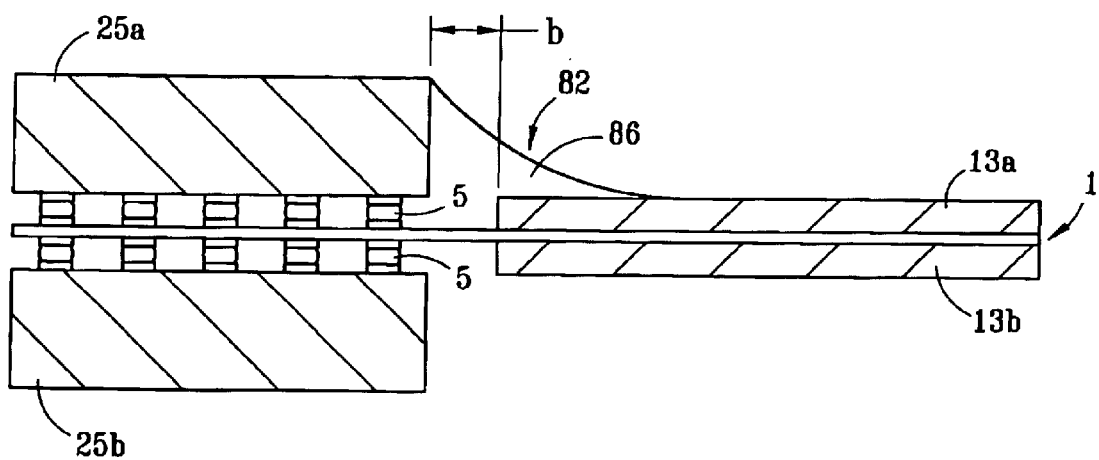
FIG. 8 is a simplified cross-sectional view through the 2ML bumped circuit assembly in accordance with a preferred embodiment of the present invention, depicting the position of the chips into the windows formed in the laminated outer conductive layers.

Referring now to FIG. 8, by using relatively thin outer conductive layers 13a and 13b, as in the present invention, the chips 25a and 25b can be placed very close to the edge of the chip windows 34a and 34b, within approximately 0.25 to 0.50 millimeters, without disturbing the formation of the fillet 86 of underfill 82. This is not possible in traditional flex-based packages with a thick, single sided stiffener, because the stiffener edge perturbs the underfill fillet formation. Even if it were possible to etch a thick stiffener sufficient to facilitate the electrical connection of some type, the location of the stiffener edge relative to the die would provide limited design utility and electrical performance enhancement.

The inherent thermal efficiency of the arrangement of the present invention will also facilitate efficient cooling primarily through the package-to-board interface for lower power devices (~1–10 W). This package construction also facilitates single sided heatsinking in higher power device packages. This enables the lowest cost alternatives at board-level assembly and eliminates the need for special design and assembly practices at the board-level.

In summary, this invention proposes a new package construction that provides a cost-effective vertical interconnect between chips by employing novel construction of a high density 2ML flex tape circuit layer in balanced lamination lay-up with relatively thin power planes on both sides of the flex. This package provides a very thin interposer that enables very high speed, vertical interconnection between the devices in the package. Additionally, this package construction provides efficient AC and DC power distribution to the devices in the vertical interconnect. Since the package is also constructed mainly of copper with very few non-thermally conductive interfaces, it is also very thermally efficient and facilitates thermal dissipation through the board on which the package is mounted as a primary thermal dissipation path for low power devices (~10 Watts or less) and an effective secondary thermal dissipation path in higher power device packages requiring heatsinks. In addition to having high performance, its preferred use of low-cost organic substrate for the interposer gives it cost advantages over alternative interposer solutions, including ceramic (both alumina and glass ceramic) and more sophisticated organic laminates, such as IBM HyperBGA®.

Although the present balanced lamination circuit assembly has particular utility where two chips are packaged face-to-face, the present invention is also beneficial where a single chip is mounted to the bumped circuit layer. The construction would preferably be the same, with the exception that only one chip window 34a or 34b would be required.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. An integrated circuit package, comprising:
    a two metal layer bumped circuit having a medial insulating layer and interconnection bumps on at least one side of an interconnection region of the circuit and being adapted for face-to-face interconnection to an integrated circuit die;
    a first adhesive lover having a thickness on a first side of the bumped circuit;
    a first outer conductive layer having a thickness bonded to the first adhesive layer;
    a second adhesive layer having a thickness substantially equal to the thickness of the first adhesive layer on a second side of the bumped circuit; and
    a second outer conductive layer bonded to the second adhesive layer, the second outer conductive layer having a thickness substantially equal to the thickness of the first outer conductive layer and relatively thick in relation to the medial insulating layer,
    wherein at least one of the first and second outer conductive layers has a window defined therethrough for receiving an integrated circuit die.

2. The integrated circuit package defined in claim 1, wherein the window has a border and further comprising an integrated circuit die having an edge, the edge being positioned no farther than about 0.5 mm from the border.

3. An integrated circuit package, comprising:
   a two metal layer bumped circuit having an array of interconnection bumps on a first side thereof and a plurality of interconnection bumps on a second side thereof;
   a first adhesive layer having a thickness on the first side of the bumped circuit;
   a first outer conductive layer having a thickness bonded to the first adhesive layer; first integrated circuit die and the second outer conductive layer having a second window defined therethrough for receiving a second integrated circuit die;
   the first adhesive layer having a first cavity defined therein disposed beneath die first window, the first cavity having a depth sufficient to expose top portions of the interconnection bumps on the first side of the bumped circuit; and
   the second adhesive layer having a first cavity defined therein disposed beneath the second window, the second cavity having a depth sufficient to expose top portions of the interconnection bumps on the second side of the bumped circuit.

4. The integrated circuit package defined in claim 3, wherein the thickness of each outer conductive layer is between about 25 microns and 300 microns.

5. The integrated circuit package defined in claim 3, wherein the conductive layer includes copper.

6. The integrated circuit package defined in claim 3, at least one of the first and second windows having a border and an integrated circuit die having an edge, the edge being positioned no farther than about 0.5 mm from the border.

* * * * *

UNITED STATES PATENT AND TRADEMARK OFFICE
CERTIFICATE OF CORRECTION

PATENT NO. : 6,876,088 B2
DATED : April 5, 2005
INVENTOR(S) : Paul Marlan Harvey It is certified that error appears in the above-identified patent and that said Letters Patent is hereby corrected as shown below:

Column 8,
Line 53, delete "lover" and insert -- layer --

Column 9,
Line 13, after "layer;" and before "first" insert -- a second adhesive layer having a thickness substantially equal to the thickness of the first adhesive layer on the second side of the bumped circuit; a second outer conductive layer bonded to the second adhesive layer, the second outer conductive layer having a thickness substantially equal to the thickness of the first outer conductive layer; the first outer conductive layer having a first window defined therethrough for receiving a --
Line 18, delete "die" and insert -- the --

Signed and Sealed this

Seventh Day of June, 2005

JON W. DUDAS
*Director of the United States Patent and Trademark Office*